United States Patent
Okuda et al.

(10) Patent No.: US 11,373,998 B2
(45) Date of Patent: Jun. 28, 2022

(54) SEMICONDUCTOR DEVICE WITH DIFFERENCES IN CRYSTALLINITY BETWEEN COMPONENTS

(71) Applicant: Mitsubishi Electric Corporation, Tokyo (JP)

(72) Inventors: Satoshi Okuda, Tokyo (JP); Tatsuro Watahiki, Tokyo (JP); Hisashi Saito, Tokyo (JP); Hiroki Muraoka, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 194 days.

(21) Appl. No.: 16/962,848

(22) PCT Filed: Jan. 16, 2019

(86) PCT No.: PCT/JP2019/001060
§ 371 (c)(1),
(2) Date: Jul. 17, 2020

(87) PCT Pub. No.: WO2019/187509
PCT Pub. Date: Oct. 3, 2019

(65) Prior Publication Data
US 2021/0366901 A1 Nov. 25, 2021

(30) Foreign Application Priority Data
Mar. 28, 2018 (JP) ............................. JP2018-061132

(51) Int. Cl.
*H01L 27/06* (2006.01)
*H01L 29/423* (2006.01)
(Continued)

(52) U.S. Cl.
CPC ...... *H01L 27/0629* (2013.01); *H01L 29/4236* (2013.01); *H01L 29/42364* (2013.01); *H01L 29/4925* (2013.01); *H01L 29/7397* (2013.01)

(58) Field of Classification Search
None
See application file for complete search history.

(56) References Cited

U.S. PATENT DOCUMENTS

| 7,602,273 | B2 | 10/2009 | Koshikawa | |
|---|---|---|---|---|
| 2012/0256255 | A1* | 10/2012 | Wu | H01L 29/1037 438/270 |

(Continued)

FOREIGN PATENT DOCUMENTS

| JP | 05-335583 A | 12/1993 |
|---|---|---|
| JP | 4791700 B2 | 10/2011 |

(Continued)

OTHER PUBLICATIONS

International Search Report and Written Opinion dated Apr. 2, 2019 for PCT/JP2019/001060 filed on Jan. 16, 2019, 13 pages including English Translation of the International Search Report.

(Continued)

*Primary Examiner* — Stephen M Bradley
*Assistant Examiner* — Wasiul Haider
(74) *Attorney, Agent, or Firm* — Xsensus LLP

(57) ABSTRACT

Reliability of a gate resistor element during high-temperature operation is enhanced. A semiconductor device includes a drift layer, a base layer, an emitter layer, a gate insulation film, a gate electrode, a gate pad electrode, a first resistance layer, and a first nitride layer. A resistor of the first resistance layer has a negative temperature coefficient. The first resistance layer is made of hydrogen-doped amorphous silicon. The first nitride layer is made of a silicon nitride layer or an aluminum nitride layer.

10 Claims, 12 Drawing Sheets

(51) Int. Cl.
   *H01L 29/49*   (2006.01)
   *H01L 29/739*  (2006.01)

(56) References Cited

U.S. PATENT DOCUMENTS

| | | |
|---|---|---|
| 2013/0069150 A1 | 3/2013 | Matsuoka et al. |
| 2015/0221566 A1* | 8/2015 | Ookura .................. H01L 22/14 |
| | | 257/48 |
| 2016/0190234 A1 | 6/2016 | Iijima et al. |
| 2017/0236914 A1 | 8/2017 | Fujimoto et al. |
| 2018/0323294 A1 | 11/2018 | Okuda et al. |

FOREIGN PATENT DOCUMENTS

| | | |
|---|---|---|
| JP | 2013-065774 A | 4/2013 |
| JP | 2016-058466 A | 4/2016 |
| JP | 2016-127073 A | 7/2016 |
| WO | 2016/114055 A1 | 7/2016 |
| WO | 2016/181903 A1 | 11/2016 |
| WO | 2017/029748 A1 | 2/2017 |
| WO | 2017/126167 A1 | 7/2017 |

OTHER PUBLICATIONS

Qingdong, C., et al., "Activation energy study of intrinsic microcrystalline silicon thin film prepared by VHF-PECVD," Optik, vol. 127, 2016, pp. 7312-7318.

* cited by examiner

F I G. 5
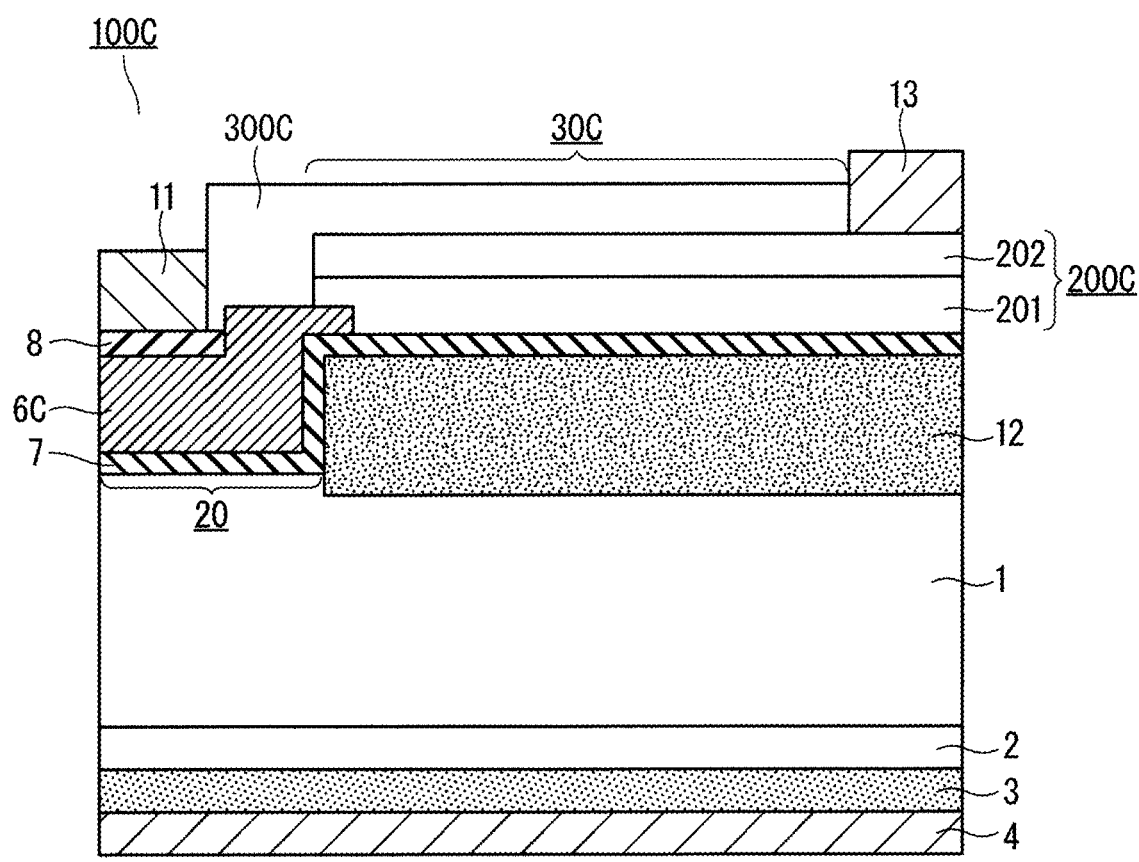

F I G. 7
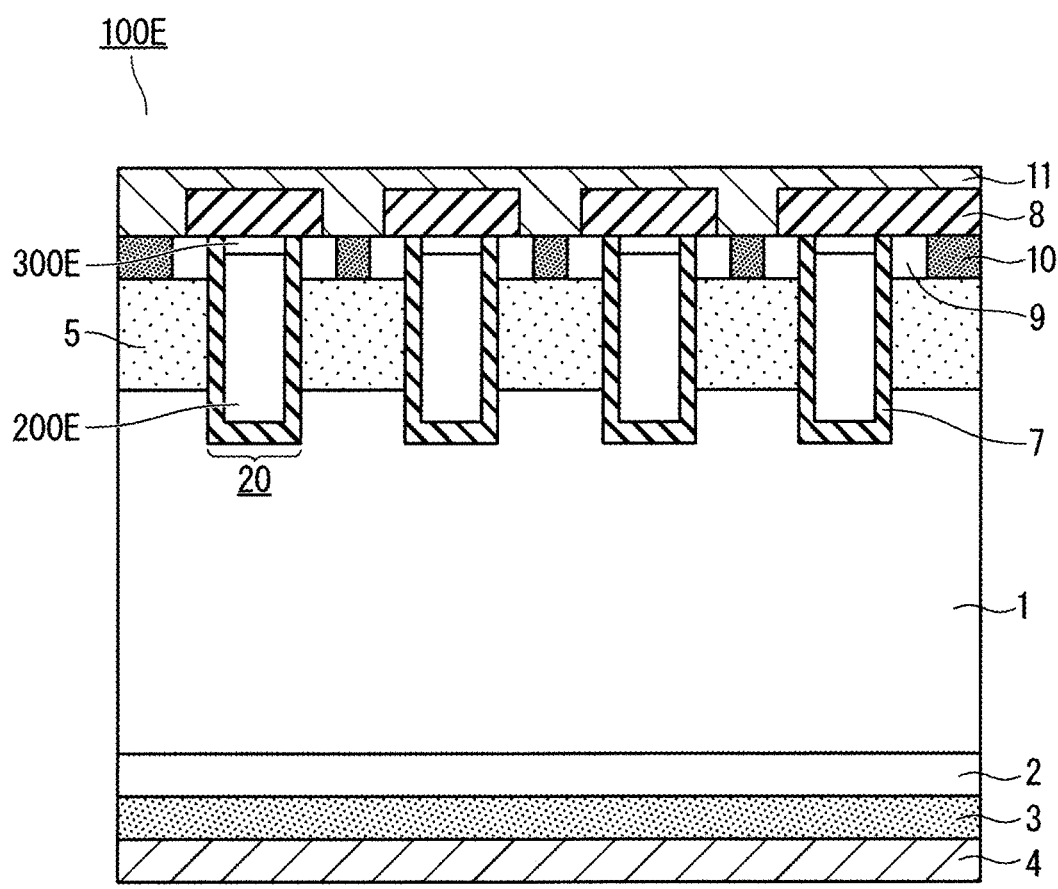

F I G. 8
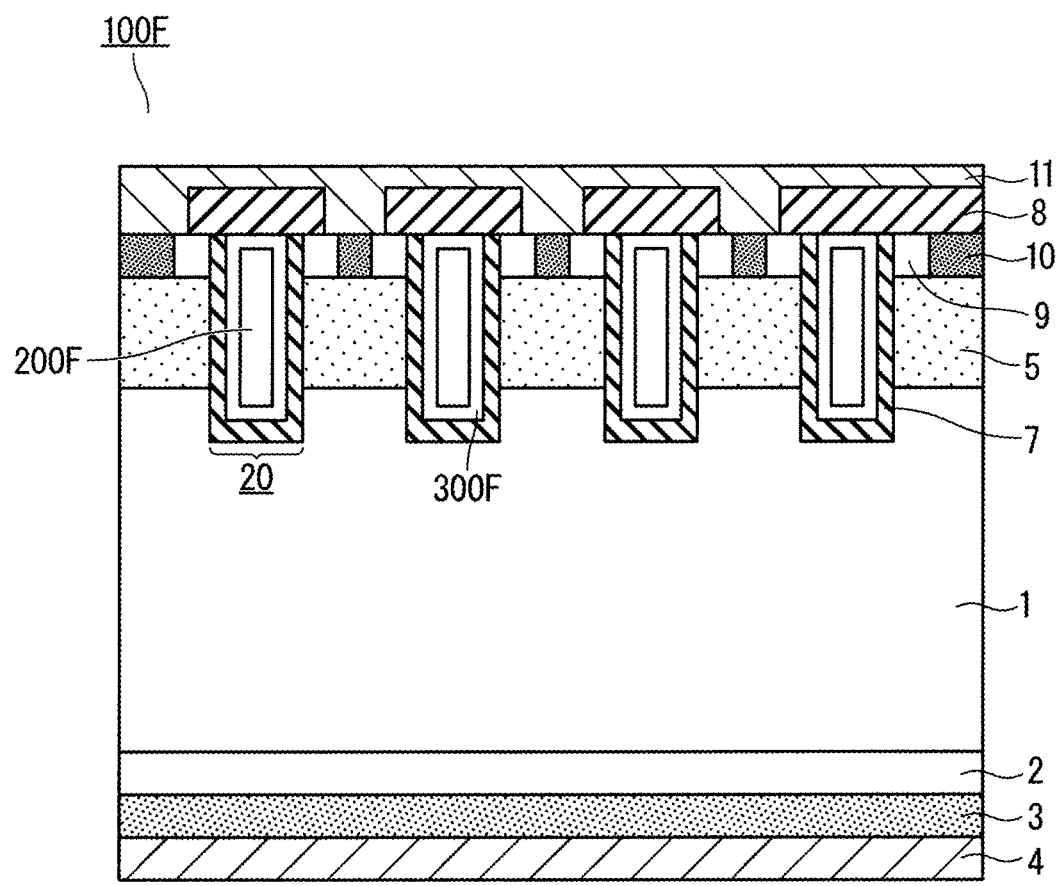

SEMICONDUCTOR DEVICE WITH DIFFERENCES IN CRYSTALLINITY BETWEEN COMPONENTS

CROSS-REFERENCE TO RELATED APPLICATIONS

The present application is based on PCT filing PCT/JP2019/001060, filed Jan. 16, 2019, which claims priority to JP2018-061132, filed Mar. 28, 2018, the entire contents of which are incorporated herein by reference.

TECHNICAL FIELD

Technology disclosed in the specification of the present application relates to a semiconductor device.

BACKGROUND ART

Inverters, which are used in various situations related to our daily lives, such as in industrial equipment, vehicles, and trains, are controlled by a power module, for example, in which a semiconductor switching element such as a metal-oxide-semiconductor field-effect transistor (i.e., a MOSFET) or an insulated gate bipolar transistor (i.e., an IGBT) is mounted. To save energy in such inverters, it is essential to reduce power loss in a semiconductor element having a function of power control.

MOS power semiconductor devices such as IGBTs and power MOSFETs are required to implement both high-temperature operation and power loss reduction. As one known method for achieving such implementation, there is a method of controlling temperature characteristics of a gate resistor to be interposed between a gate electrode of a MOS power semiconductor device and a drive circuit.

As one known method of controlling temperature characteristics of a gate resistor, for example, there is a method of reducing temperature variation of a gate resistor by combining a resistive element having negative temperature characteristics and a resistive element having positive temperature characteristics (see Patent Document 1 and Patent Document 2, for example).

Here, known examples of such a resistive element having negative temperature characteristics include amorphous silicon and microcrystalline silicon containing additives of hydrogen as impurities (see Non-Patent Document 1, for example).

PRIOR ART DOCUMENTS

Patent Documents

Patent Document 1: WO 2017/029748
Patent Document 2: Japanese Patent No. 4791700

Non-Patent Documents

Non-Patent Document 1: Chen Qingdong et al., Optik 127 (2016) 7312-7318. "Activation energy study of intrinsic microcrystalline silicon thin film prepared by VHF-PECVD"

SUMMARY

Problem to be Solved by the Invention

When a MOS power semiconductor device with an embedded gate resistor is used under high temperature, use of amorphous silicon containing additives of hydrogen as impurities as a gate resistor having negative temperature characteristics may cause desorption of hydrogen from amorphous silicon during high-temperature operation. This may lead to variation in temperature characteristics and variation in a resistance value of the gate resistor, resulting in deterioration in reliability of the gate resistor.

The technology disclosed in the specification of the present application is made to solve the problems as described above, and has an object to provide technology for enhancing reliability of a gate resistor during high-temperature operation.

Means to Solve the Problem

The first aspect of the technology disclosed in the specification of the present application includes: a first conductivity-type drift layer; a second conductivity-type base layer being formed on a surface layer of the first conductivity-type drift layer; a first conductivity-type emitter layer being selectively formed on a surface layer of the second conductivity-type base layer; a gate insulation film being formed in contact with the second conductivity-type base layer being interposed between the first conductivity-type drift layer and the first conductivity-type emitter layer; a gate electrode being formed in contact with the gate insulation film; a gate pad electrode being formed apart from the gate electrode; a first resistance layer electrically connecting the gate electrode and the gate pad electrode; and a first nitride layer being formed to cover an upper surface of the first resistance layer. A resistor of the first resistance layer has a negative temperature coefficient. The first resistance layer is made of hydrogen-doped amorphous silicon. The first nitride layer is made of a silicon nitride layer or an aluminum nitride layer.

The second aspect of the technology disclosed in the specification of the present application includes: a first conductivity-type drift layer; a second conductivity-type base layer being formed on a surface layer of the first conductivity-type drift layer; a first conductivity-type emitter layer being selectively formed on a surface layer of the second conductivity-type base layer; a trench being formed to extend from an upper surface of the first conductivity-type drift layer into the first conductivity-type drift layer, penetrating the first conductivity-type emitter layer and the second conductivity-type base layer; a gate insulation film being formed along a bottom surface and a side surface of the trench; a first gate electrode being formed inside the trench being surrounded by the gate insulation film; and a first nitride layer being formed to cover at least an upper surface of the first gate electrode. A resistor of the first gate electrode has a negative temperature coefficient. The first gate electrode is made of hydrogen-doped amorphous silicon. At least a part of the first gate electrode contains 1% or more of hydrogen in atomic composition ratio. The first nitride layer is made of a silicon nitride layer or an aluminum nitride layer.

The third aspect of the technology disclosed in the specification of the present application includes: a first conductivity-type drift layer; a second conductivity-type base layer being formed on a surface layer of the first conductivity-type drift layer; a first conductivity-type emitter layer being selectively formed on a surface layer of the second conductivity-type base layer; a first trench and a plurality of second trenches being formed to extend from an upper surface of the first conductivity-type drift layer into the first conductivity-type drift layer, penetrating the second conductivity-type base layer; a third trench being formed to extend from the upper surface of the first conductivity-type drift layer into the first conductivity-type drift layer, penetrating the first conductivity-type emitter layer and the second conductivity-type base layer; a gate insulation film being formed along a bottom surface and a side surface of the first trench, the plurality of second trenches, and the third trench; a first gate electrode being formed inside the first trench being surrounded by the gate insulation film; a second gate electrode being formed inside the plurality of second trenches being surrounded by the gate insulation film and inside the third trench being surrounded by the gate insulation film; and a nitride layer being formed to cover at least an upper surface of the first gate electrode. The second gate electrode inside the third trench and the first gate electrode inside the plurality of second trenches are connected to a gate terminal. A resistor of the first gate electrode has a negative temperature coefficient. The first gate electrode is made of hydrogen-doped amorphous silicon. At least a part of the first gate electrode contains 1% or more of hydrogen in atomic composition ratio. The nitride layer is made of silicon nitride or aluminum nitride.

Effects of the Invention

The first aspect of the technology disclosed in the specification of the present application includes: a first conductivity-type drift layer; a second conductivity-type base layer being formed on a surface layer of the first conductivity-type drift layer; a first conductivity-type emitter layer being selectively formed on a surface layer of the second conductivity-type base layer; a gate insulation film being formed in contact with the second conductivity-type base layer being interposed between the first conductivity-type drift layer and the first conductivity-type emitter layer; a gate electrode being formed in contact with the gate insulation film; a gate pad electrode being formed apart from the gate electrode; a first resistance layer electrically connecting the gate electrode and the gate pad electrode; and a first nitride layer being formed to cover an upper surface of the first resistance layer. A resistor of the first resistance layer has a negative temperature coefficient. The first resistance layer is made of hydrogen-doped amorphous silicon. The first nitride layer is made of a silicon nitride layer or an aluminum nitride layer. According to such a configuration, the first nitride layer is formed on the upper surface of the first resistance layer being amorphous silicon containing additives of hydrogen. Therefore, desorption of hydrogen from the first resistance layer being amorphous silicon can be reduced even during high-temperature operation. As a result, variation in temperature characteristics and a resistance value of a gate resistor element is reduced, and reliability of the gate resistor element can be enhanced.

The second aspect of the technology disclosed in the specification of the present application includes: a first conductivity-type drift layer; a second conductivity-type base layer being formed on a surface layer of the first conductivity-type drift layer; a first conductivity-type emitter layer being selectively formed on a surface layer of the second conductivity-type base layer; a trench being formed to extend from an upper surface of the first conductivity-type drift layer into the first conductivity-type drift layer, penetrating the first conductivity-type emitter layer and the second conductivity-type base layer; a gate insulation film being formed along a bottom surface and a side surface of the trench; a first gate electrode being formed inside the trench being surrounded by the gate insulation film; and a first nitride layer being formed to cover at least an upper surface of the first gate electrode. A resistor of the first gate electrode has a negative temperature coefficient. The first gate electrode is made of hydrogen-doped amorphous silicon. At least a part of the first gate electrode contains 1% or more of hydrogen in atomic composition ratio. The first nitride layer is made of a silicon nitride layer or an aluminum nitride layer. According to such a configuration, when the first gate electrode having a negative temperature coefficient is formed in the trench, gate resistance can be changed sensitively to temperature variation of an element. Accordingly, temperature increase in the element can be moderated, with current concentration being reduced. Therefore, both reliability enhancement and power loss reduction of the gate resistor can be achieved. Further, when the first nitride layer is formed on the upper surface of the first gate electrode, desorption of hydrogen from the first gate electrode can be reduced. Consequently, long-term reliability of the gate resistor can be enhanced.

The third aspect of the technology disclosed in the specification of the present application includes: a first conductivity-type drift layer; a second conductivity-type base layer being formed on a surface layer of the first conductivity-type drift layer; a first conductivity-type emitter layer being selectively formed on a surface layer of the second conductivity-type base layer; a first trench and a plurality of second trenches being formed to extend from an upper surface of the first conductivity-type drift layer into the first conductivity-type drift layer, penetrating the second conductivity-type base layer; a third trench being formed to extend from the upper surface of the first conductivity-type drift layer into the first conductivity-type drift layer, penetrating the first conductivity-type emitter layer and the second conductivity-type base layer; a gate insulation film being formed along a bottom surface and a side surface of the first trench, the plurality of second trenches, and the third trench; a first gate electrode being formed inside the first trench being surrounded by the gate insulation film; a second gate electrode being formed inside the plurality of second trenches being surrounded by the gate insulation film and inside the third trench being surrounded by the gate insulation film; and a nitride layer being formed to cover at least an upper surface of the first gate electrode. The second gate electrode inside the third trench and the first gate electrode inside the plurality of second trenches are connected to a gate terminal. A resistor of the first gate electrode has a negative temperature coefficient. The first gate electrode is made of hydrogen-doped amorphous silicon. At least a part of the first gate electrode contains 1% or more of hydrogen in atomic composition ratio. The nitride layer is made of silicon nitride or aluminum nitride. According to such a configuration, reliability of the gate resistor during high-temperature operation can be enhanced.

These and other objects, features, aspects and advantages of the technology disclosed in the specification of the present application will become more apparent from the following detailed description when taken in conjunction with the accompanying drawings.

BRIEF DESCRIPTION OF DRAWINGS

FIG. 5 is a cross-sectional schematic diagram illustrating an example of a configuration in a region including a gate resistor region embedded into a semiconductor chip according to an embodiment.

FIG. 7 is a cross-sectional schematic diagram illustrating an example of a configuration of an active region of a semiconductor device according to an embodiment.

FIG. 8 is a cross-sectional schematic diagram illustrating a modification of a configuration of an active region of a semiconductor device according to an embodiment.

DESCRIPTION OF EMBODIMENTS

Figure 1:
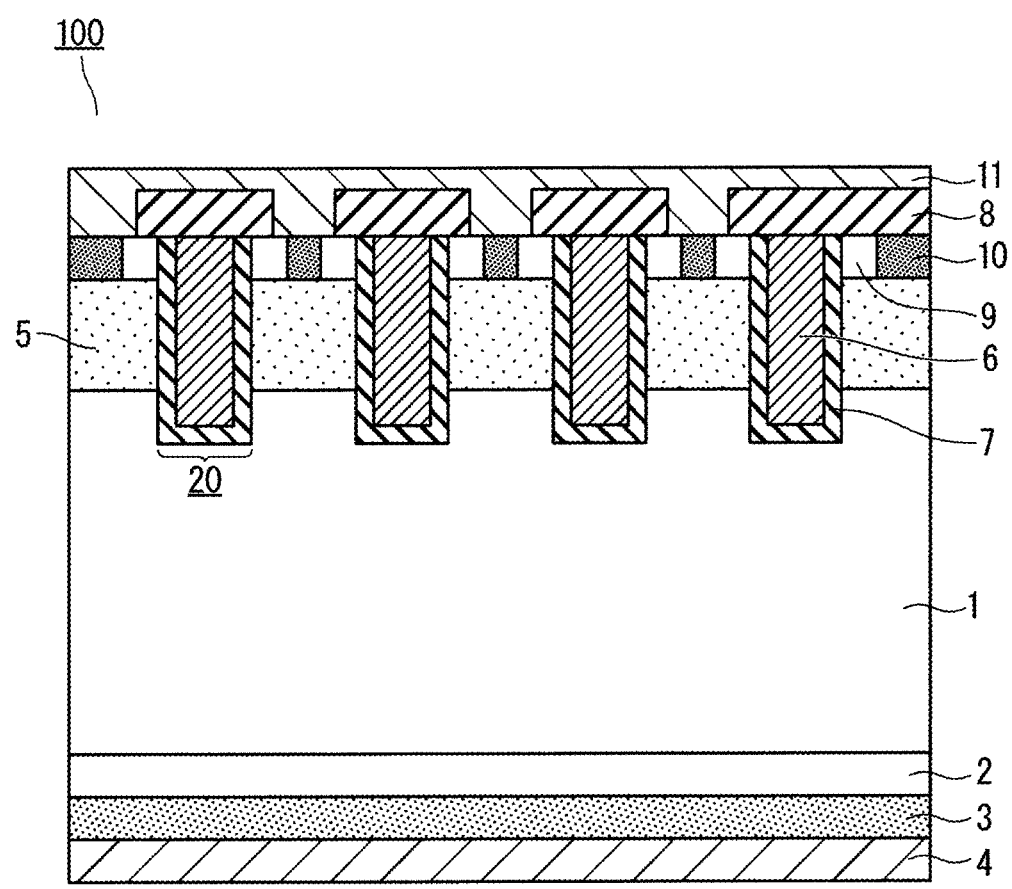
FIG. 1 is a cross-sectional schematic diagram illustrating an example of a configuration of an active region of a semiconductor device according to an embodiment.

Embodiments will be described below with reference to the attached drawings.

Note that the drawings are schematically illustrated, and configurations are omitted or configurations are simplified as appropriate for the sake of description. Further, interrelationship of the size and the position of the configurations or the like illustrated in different drawings is not necessarily accurately illustrated, and may be changed as appropriate. Further, the drawings other than cross-sectional views, such as plan views, may also be hatched for the sake of better understanding of the details of the embodiments.

Further, in the following description, similar components are denoted by the same reference signs, and similar terms and functions apply for such components as well. Accordingly, detailed description for such components may be omitted to avoid redundancy.

Further, if terms indicating specific positions and directions, such as "up", "down", "left", "right", "side", "bottom", "front", and "back", are used in the description described below, these terms are used merely for the sake of convenience to help better understanding of the details of the embodiments, and do not indicate directions in actual implementation.

Further, if ordinal numbers, such as "first" and "second", are used in the description described below, these terms are used merely for the sake of convenience to help better understanding of the details of the embodiments, and the order that may be indicated by such ordinal numbers or the like is not restrictive.

Further, in the following description, n and p each indicate a conductivity type of a semiconductor. Further, $n^{--}$ indicates that impurity concentration is lower than concentration of $n^-$, $n^-$ indicates that impurity concentration is lower than concentration of n, and $n^+$ indicates that impurity concentration is higher than concentration of n. In a similar manner, $p^-$ indicates that impurity concentration is lower than concentration of p, and $p^+$ indicates that impurity concentration is higher than concentration of p.

Further, in the following description, the first direction being a direction in which semiconductor layers to be described later are stacked is set as an upper direction, and the second direction being a direction opposite to the direction is set as a lower direction. Further, a surface facing the upper direction is referred to as an upper surface, and a surface facing the lower direction is referred to as a lower surface.

In addition, in the following description, the first conductivity type is represented by n, $n^-$, $n^{--}$, or $n^+$, and the second conductivity type is represented by p, $p^-$, or $p^+$. However, the relationship of these conductivity types may be reversed.

First Embodiment

A semiconductor device according to the present embodiment will be described below. In the present embodiment, an IGBT as an example of a semiconductor device will be described.

<Configuration of Semiconductor Device>

FIG. 1 is a cross-sectional schematic diagram illustrating an example of a configuration of an active region of a semiconductor device according to the present embodiment.

As illustrated in FIG. 1, in a semiconductor device 100, an $n^-$-type silicon substrate is used as an $n^-$-type drift layer 1. Further, a p-type base layer 5 is formed on the surface layer of the $n^-$-type drift layer 1.

Further, on the surface layer of the p-type base layer 5, an $n^+$-type emitter layer 9 and a $p^+$-type contact layer 10 are selectively formed.

Further, trenches 20 are formed to extend from the upper surface of the $n^-$-type drift layer 1 into the $n^-$-type drift layer 1, penetrating the $n^+$-type emitter layer 9 and the p-type base layer 5. A gate insulation film 7 is formed along the bottom surface and the side surface of each trench 20, and a gate electrode 6 is formed inside each trench 20 surrounded by the gate insulation film 7. For the gate electrode 6, for example, low-resistance polysilicon is used.

The trench 20 extends in the depth direction of FIG. 1, and is connected to a gate pad electrode (not illustrated herein).

Further, an inter-layer insulation film 8 covering each trench 20 is formed, and an emitter electrode 11 covering the inter-layer insulation film 8 and an exposed part of the $n^+$-type emitter layer 9 and the $p^+$-type contact layer 10 is formed.

Further, an n-type buffer layer 2 is formed on the lower surface of the $n^-$-type drift layer 1, a $p^+$-type collector layer 3 is formed on the lower surface of the n-type buffer layer 2, and a collector electrode 4 is formed on the lower surface of the $p^+$-type collector layer 3.

Incidentally, to adjust switching speed of IGBTs, a gate resistor is used. In the related art, a desired resistive element is externally attached to each of a gate pad electrode and a gate drive circuit outside a semiconductor chip.

Figure 2:
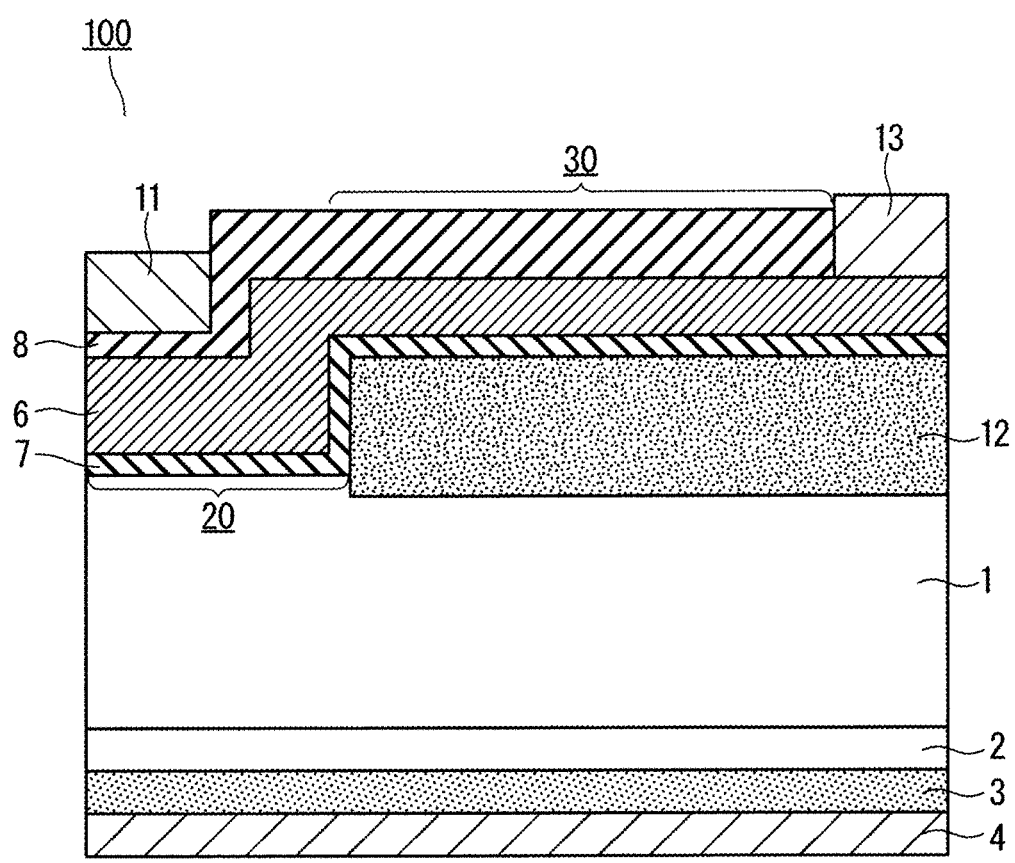
FIG. 2 is a cross-sectional schematic diagram illustrating an example of a configuration in a region including a gate resistor region embedded into a semiconductor chip.

In contrast, to reduce the number of components of external components, a resistive element may be embedded into a semiconductor chip. FIG. 2 is a cross-sectional schematic diagram illustrating an example of a configuration in a region including a gate resistor region embedded into a semiconductor chip.

The gate electrode 6 extends from the trench 20 in the active region illustrated in FIG. 1, and then extends upwardly so as to lie above the upper surface of the n⁻-type drift layer 1 at an end portion of the semiconductor chip. Below the lower surface of the upwardly extending gate electrode 6, a p-type well layer 12 is formed, with the gate insulation film 7 being interposed therebetween. Further, on the upper surface of the upwardly extending gate electrode 6, the inter-layer insulation film 8 is formed.

A gate wiring region, which is a region before such a gate electrode 6 is electrically connected to a gate pad electrode 13, constitutes an embedded gate resistor 30. The resistance value of the embedded gate resistor 30 can be controlled by adjusting the length of the gate wiring region. Note that the gate pad electrode 13 is formed in contact with the upper surface of the gate electrode 6.

Figure 11:
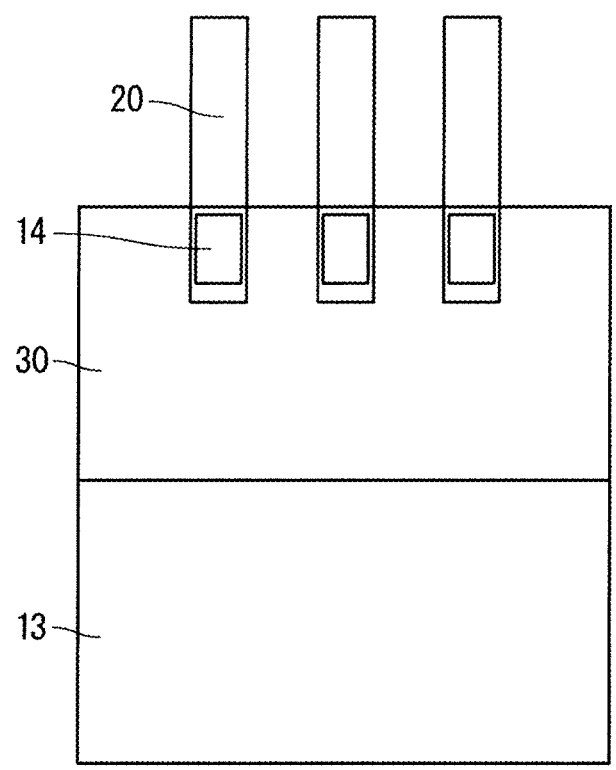
FIG. 11 is a plan schematic diagram illustrating an example of a configuration in a region including a gate resistor region.

FIG. 11 is a plan schematic diagram illustrating an example of a configuration in a region including a gate resistor region. The trenches 20 extending from the active region pass through respective contact holes 14, and then extend upwardly so as to lie above the surface of the n⁻-type drift layer 1. The embedded gate resistor 30 is formed on the upper surface of the n⁻-type drift layer 1. The embedded gate resistor 30 is further connected to the gate pad electrode 13.

IGBTs are required to implement both high-temperature operation and power loss reduction. To achieve such implementation, it is necessary to control temperature characteristics of a gate resistor. In this respect, it is conceivable to control temperature characteristics of a gate resistor by connecting a material having a negative temperature coefficient whose resistance decreases in response to temperature increase, such as a thermistor, to a part between a gate pad electrode of an IGBT and a gate drive circuit.

However, externally attaching a component to a semiconductor chip results in increasing the number of components of a module. In the light of this, a method of using a material having a negative temperature coefficient whose resistance decreases in response to temperature increase for a part of all of the embedded gate resistor 30 is herein considered.

According to this method, at low temperatures, resistance of a certain value can be maintained so that oscillation of a turn-off voltage or a surge voltage is reduced, while at high temperatures, gate resistance can be reduced so that switching loss is reduced. In this method, a material having a negative temperature coefficient is embedded into a semiconductor chip. Therefore, the number of components is not increased.

An attempt to connect a resistive element having a negative temperature coefficient to a gate electrode of a semiconductor switching element has been discussed with the intention of producing a fixed gate resistance value with respect to temperature, by use of a resistive element having a positive temperature coefficient in combination (for example, Patent Document 1 or Patent Document 2).

However, a method in which the entire gate resistor has a negative temperature coefficient has not hitherto been discussed. Known examples of such a material whose resistance shows a negative temperature coefficient include amorphous silicon and microcrystalline silicon containing additives of hydrogen as impurities, as disclosed in Non-Patent Document 1.

Figure 3:
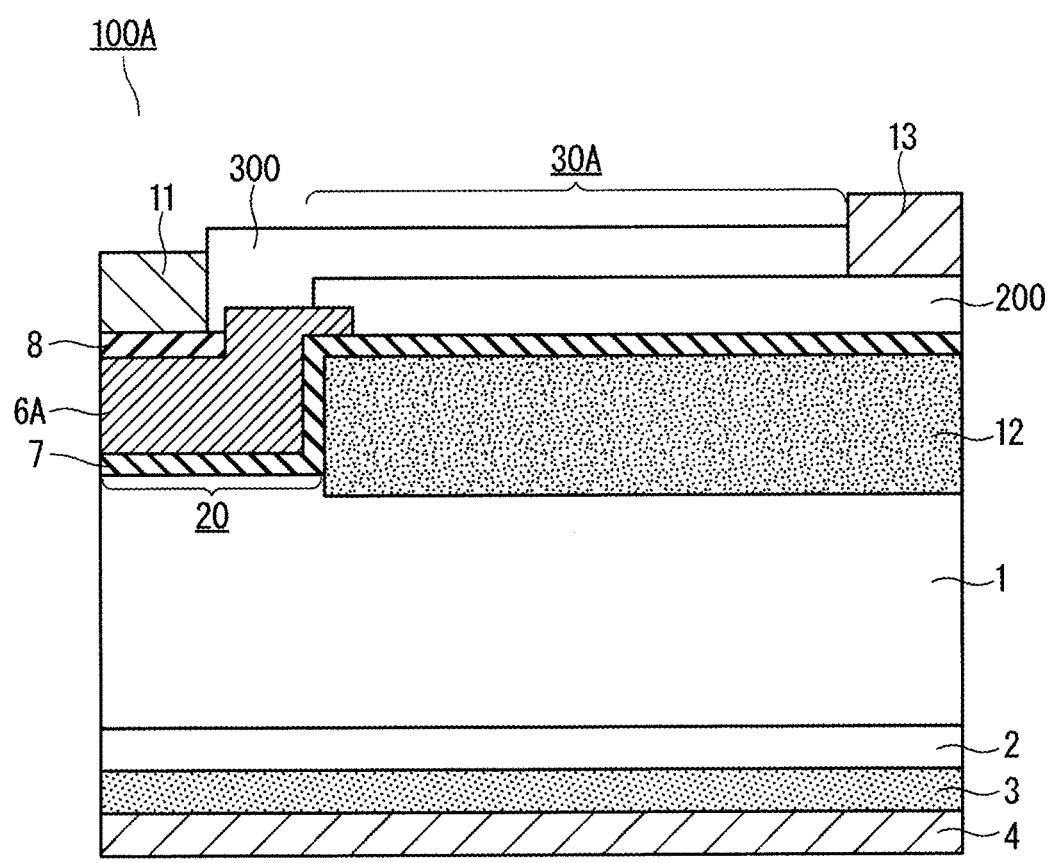
FIG. 3 is a cross-sectional schematic diagram illustrating an example of a configuration in a region including a gate resistor region embedded into a semiconductor chip.

FIG. 3 is a cross-sectional schematic diagram illustrating an example of a configuration in a region including a gate resistor region embedded into a semiconductor chip when such materials are used as an embedded gate resistor.

As illustrated in FIG. 3, a semiconductor device 100A includes an n⁻-type drift layer 1, a trench 20 formed on the surface layer of the n⁻-type drift layer 1, a gate insulation film 7, a gate electrode 6A, an inter-layer insulation film 8, a semiconductor layer 200, a nitride layer 300, a p-type well layer 12, an emitter electrode 11, a gate pad electrode 13, an n-type buffer layer 2, a p⁺-type collector layer 3, and a collector electrode 4.

The gate insulation film 7 extends upwardly from the bottom surface of the trench 20, and is also formed on the upper surface of the n⁻-type drift layer 1. The gate electrode 6A is formed above a part of the upper surface of the n⁻-type drift layer 1 and inside the trench 20, with the gate insulation film 7 being interposed therebetween. For the gate electrode 6A, for example, low-resistance polysilicon is used.

The inter-layer insulation film 8 is formed on the upper surface of the gate electrode 6A. The semiconductor layer 200 is formed above a part of the upper surface of the n⁻-type drift layer 1, with the gate insulation film 7 being interposed therebetween.

The nitride layer 300 is formed to cover a part of the upper surface of the inter-layer insulation film 8, a part of the upper surface of the gate electrode 6A, and a part of the upper surface of the semiconductor layer 200.

The p-type well layer 12 is formed on the lower surface of the gate insulation film 7, which is formed above the upper surface of the n⁻-type drift layer 1. The emitter electrode 11 is formed on a part of the upper surface of the inter-layer insulation film 8. The gate pad electrode 13 is formed to cover a part of the upper surface of the semiconductor layer 200.

Further, an n-type buffer layer 2 is formed on the lower surface of the n⁻-type drift layer 1, a p⁺-type collector layer 3 is formed on the lower surface of the n-type buffer layer 2, and a collector electrode 4 is formed on the lower surface of the p⁺-type collector layer 3.

The semiconductor layer 200 is hydrogen-doped amorphous silicon or microcrystalline silicon having a negative temperature coefficient. Further, at least a part of the semiconductor layer 200 contains 1% or more of hydrogen in atomic composition ratio.

Amorphous silicon containing no hydrogen contains a large number of dangling bonds, and thus contains a large number of defect levels formed inside. Thus, adding hydrogen can terminate such dangling bonds, and can thereby provide properties specific to semiconductors. In this case, the amount of hydrogen to be added is at least 1% or more in atomic composition ratio, particularly more preferably 10% or more.

The semiconductor layer 200 is formed between the gate pad electrode 13 and the gate electrode 6A, and constitutes a part or all of the embedded gate resistor 30A. The semiconductor layer 200 electrically connects the gate pad electrode 13 and the gate electrode 6A. The resistance value of the embedded gate resistor 30A is determined by the length of the embedded gate resistor 30A, or the resistivity value of the semiconductor layer 200.

The resistivity of the semiconductor layer 200 is adjusted through addition of hydrogen in the semiconductor layer 200, or impurities such as phosphorus, boron, or arsenic, at appropriate concentration. Owing to this configuration, an embedded gate resistor having an appropriate resistance value and a negative temperature coefficient can be formed.

Higher crystallinity of the semiconductor layer 200 means more activation energy. This mitigates temperature dependence of resistance. Accordingly, temperature dependence of resistance can be designed based on crystallinity of the semiconductor layer 200.

For example, such amorphous silicon or microcrystalline silicon is manufactured with the plasma chemical vapor deposition (i.e., CVD) method using a mixed gas of silane ($SiH_4$) and phosphine ($PH_3$). Dopant concentration of hydrogen or phosphorus can be adjusted by changing the flow rate of the gas.

Further, in the present embodiment, as illustrated in FIG. 3, the gate electrode 6A made of doped polysilicon or the like and the semiconductor layer 200 are directly connected.

According to such a configuration, stray capacitance is not generated in the gate electrode 6A. As a result, an embedded gate resistor having a negative temperature coefficient can be formed without causing an increase in the amount of electric charge necessary for charge and discharge of the gate electrode 6A.

When exposed to high temperature during the manufacturing process or during the use of the semiconductor device, hydrogen in the semiconductor layer 200 desorbs from the semiconductor layer 200 to be released into the atmosphere. In this case, the resistance of the semiconductor layer 200 varies and long-term reliability of an IGBT element is thus deteriorated, which has been posing a problem. The rated operating temperature for IGBTs has been increasing in recent years, and accordingly there has been a strong demand for long-term reliability for high-temperature operation.

In view of this, to reduce desorption of hydrogen from the semiconductor layer 200, the nitride layer 300 covering the semiconductor layer 200 is formed. For the nitride layer 300, silicon nitride (SiN) or aluminum nitride (AlN) is used. The thickness of the nitride layer 300 is 10 nm or more, particularly preferably 50 nm or more.

According to such a configuration, desorption of hydrogen from the semiconductor layer 200 can be reduced, with the embedded gate resistor 30A having a negative temperature coefficient. This configuration can produce an effect of reducing switching loss caused by a gate resistor of a semiconductor device having a negative temperature coefficient, and can enhance long-term reliability of the gate resistor.

Second Embodiment

A semiconductor device according to the present embodiment will be described. In the following description, components that are similar to the components described in the above-described embodiment are denoted by the same reference signs in the drawings, and detailed description thereof will be omitted as appropriate.

<Configuration of Semiconductor Device>

Figure 4:
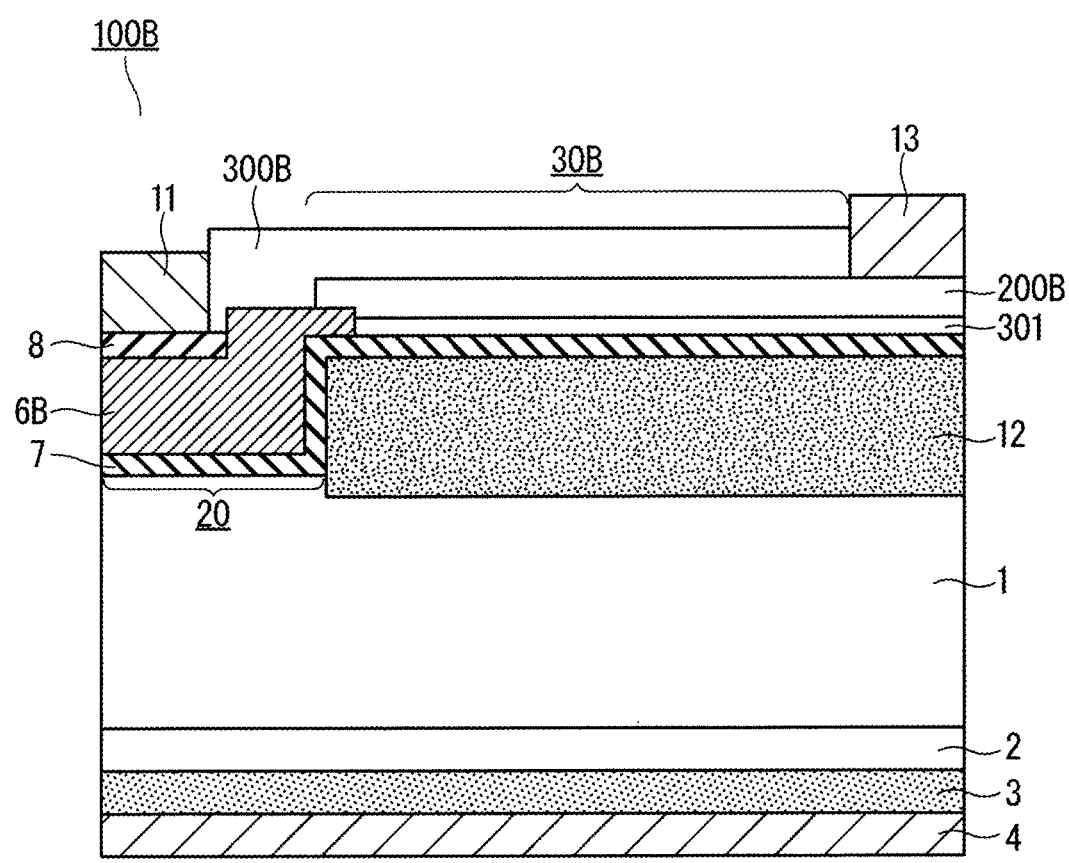
FIG. 4 is a cross-sectional schematic diagram illustrating an example of a configuration in a region including a gate resistor region embedded into a semiconductor chip according to an embodiment.

FIG. 4 is a cross-sectional schematic diagram illustrating an example of a configuration in a region including a gate resistor region embedded into a semiconductor chip according to the present embodiment.

As illustrated in FIG. 4, in a semiconductor device 100B, a semiconductor layer 200B constitutes a part or all of an embedded gate resistor 30B, similarly to the first embodiment. The semiconductor layer 200B is hydrogen-doped amorphous silicon or microcrystalline silicon having a negative temperature coefficient. Further, the semiconductor layer 200B may be doped with impurities such as phosphorus, boron, or arsenic at appropriate concentration.

A nitride layer 300B is formed on the upper surface of the semiconductor layer 200B. The nitride layer 300B is made of silicon nitride (SiN) or aluminum nitride (AlN). The nitride layer 300B is formed to cover a part of the upper surface of the inter-layer insulation film 8, a part of the upper surface of the gate electrode 6B, and a part of the upper surface of the semiconductor layer 200B. The gate electrode 6B is formed above a part of the upper surface of the $n^-$-type drift layer 1 and inside the trench 20, with the gate insulation film 7 being interposed therebetween.

Further, in the present embodiment, a nitride layer 301 is formed on the lower surface of the semiconductor layer 200B. The nitride layer 301 is formed above the upper surface of the p-type well layer 12, with the gate insulation film 7 being interposed therebetween.

According to such a configuration, desorption of hydrogen from the semiconductor layer 200B into the gate insulation film 7 can be reduced. Consequently, long-term reliability of the embedded gate resistor 30B can be enhanced. Further, deterioration in performance of the semiconductor device due to entering of hydrogen atoms into the gate insulation film 7 can be reduced. Owing to such configurations, variation in the resistance value of the embedded gate resistor 30B is reduced, and reliability of the gate insulation film 7 is enhanced. As a result, a semiconductor device having a high long-term reliability can be provided.

Third Embodiment

A semiconductor device according to the present embodiment will be described. In the following description, components that are similar to the components described in the above-described embodiments are denoted by the same reference signs in the drawings, and detailed description thereof will be omitted as appropriate.

<Configuration of Semiconductor Device>

FIG. 5 is a cross-sectional schematic diagram illustrating an example of a configuration in a region including a gate resistor region embedded into a semiconductor chip according to the present embodiment.

In a semiconductor device 100C according to the present embodiment, a semiconductor layer 200C constituting an embedded gate resistor 30C consists of two separate layers stacked in a direction perpendicular to the semiconductor substrate.

As illustrated in FIG. 5, the semiconductor layer 200C is formed above the upper surface of the p-type well layer 12, with the gate insulation film 7 being interposed therebetween. Further, the semiconductor layer 200C includes a semiconductor layer 201 formed in contact with the gate insulation film 7, and a semiconductor layer 202 formed on the upper surface of the semiconductor layer 201.

The semiconductor layer 201 is made of hydrogen-doped amorphous silicon. In contrast, the semiconductor layer 202 is made of amorphous silicon or microcrystalline silicon having crystallinity higher than crystallinity of the semiconductor layer 201. Further, at least a part of the semiconductor layer 201 and the semiconductor layer 202 contains 1% or more of hydrogen in atomic composition ratio.

Further, the semiconductor layer 201 and the semiconductor layer 202 may be doped with impurities such as phosphorus, boron, or arsenic at appropriate concentration.

Further, a nitride layer 300C is formed to cover the semiconductor layer 202. For the nitride layer 300C, silicon nitride (SiN) or aluminum nitride (AlN) is used. The nitride layer 300C is formed to cover a part of the upper surface of the inter-layer insulation film 8, a part of the upper surface of a gate electrode 6C, and a part of the upper surface of the semiconductor layer 202. The gate electrode 6C is formed above a part of the upper surface of the n⁻-type drift layer 1 and inside the trench 20, with the gate insulation film 7 being interposed therebetween.

According to such a configuration, desorption of hydrogen from the semiconductor layer 201 can be reduced by the semiconductor layer 202 and the nitride layer 300C. Therefore, time-dependent variation in a resistance value of the embedded gate resistor 30C can be reduced. As a result, a semiconductor device having high long-term reliability can be provided.

Fourth Embodiment

A semiconductor device according to the present embodiment will be described. In the following description, components that are similar to the components described in the above-described embodiments are denoted by the same reference signs in the drawings, and detailed description thereof will be omitted as appropriate.

<Configuration of Semiconductor Device>

Figure 6:
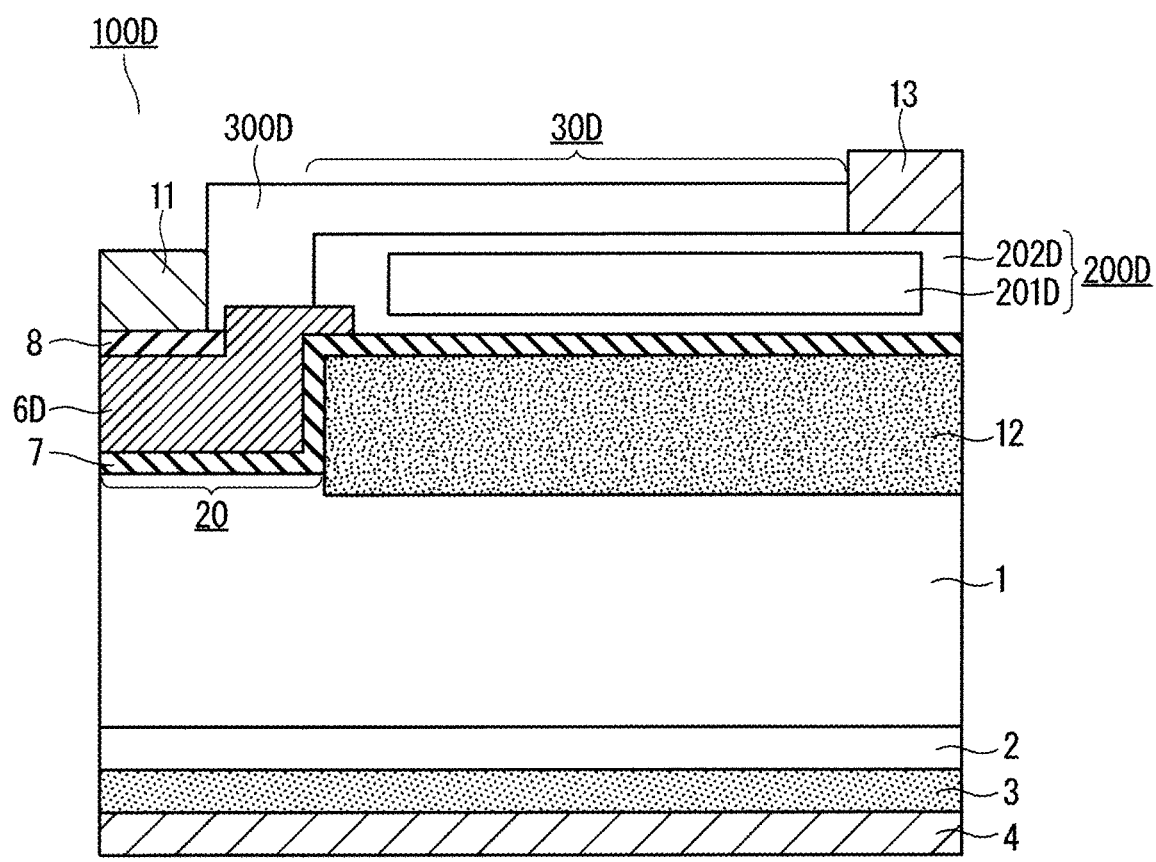
FIG. 6 is a cross-sectional schematic diagram illustrating an example of a configuration in a region including a gate resistor region embedded into a semiconductor chip according to an embodiment.

FIG. 6 is a cross-sectional schematic diagram illustrating an example of a configuration in a region including a gate resistor region embedded into a semiconductor chip according to the present embodiment.

In a semiconductor device 100D according to the present embodiment, a semiconductor layer 201D is covered by a semiconductor layer 202D.

As illustrated in FIG. 6, a semiconductor layer 200D includes a semiconductor layer 201D, and a semiconductor layer 202D formed on the upper surface, the side surface, and the lower surface of the semiconductor layer 201D.

The semiconductor layer 201D is made of hydrogen-doped amorphous silicon. In contrast, the semiconductor layer 202D is made of amorphous silicon or microcrystalline silicon having crystallinity higher than crystallinity of the semiconductor layer 201D. At least a part of the semiconductor layer 201D and the semiconductor layer 202D contains 1% or more of hydrogen in atomic composition ratio.

Further, the semiconductor layer 201D and the semiconductor layer 202D may be doped with impurities such as phosphorus, boron, or arsenic at appropriate concentration.

Further, a nitride layer 300D is formed to cover the semiconductor layer 202D. For the nitride layer 300D, silicon nitride (SiN) or aluminum nitride (AlN) is used. The nitride layer 300D is formed to cover a part of the upper surface of the inter-layer insulation film 8, a part of the upper surface of a gate electrode 6D, and a part of the upper surface of the semiconductor layer 202D. The gate electrode 6D is formed above a part of the upper surface of the n⁻-type drift layer 1 and inside the trench 20, with the gate insulation film 7 being interposed therebetween.

When the structure illustrated in FIG. 6 is manufactured, first, the semiconductor layer 202D is formed in a region to be an embedded gate resistor 30D. Then, by means of photolithography, the semiconductor layer 201D is formed only in a partial region of the upper surface of the semiconductor layer 202D. Subsequently, the semiconductor layer 202D is formed on the entire region to be the embedded gate resistor 30D again.

According to such a configuration, desorption of hydrogen from the semiconductor layer 201D can be further reduced. Further, time-dependent variation in a resistance value of the embedded gate resistor 30D can be reduced. As a result, a semiconductor device having high long-term reliability can be provided.

Note that, as a modification of the configuration according to the present embodiment, the semiconductor layer 202D may be formed on only the upper part of the semiconductor layer 201D and the lower part of the semiconductor layer 201D. In such a case as well, an effect of reducing desorption of hydrogen from the semiconductor layer 201D can be achieved.

Modification of First to Fourth Embodiments

The above-described embodiments describe an example in which a trench gate IGBT is used as a switching element. However, the above-described embodiments can also be applied when a planar IGBT or a MOSFET is used.

Fifth Embodiment

A semiconductor device according to the present embodiment will be described. In the following description, components that are similar to the components described in the above-described embodiments are denoted by the same reference signs in the drawings, and detailed description thereof will be omitted as appropriate.

<Configuration of Semiconductor Device>

FIG. 7 is a cross-sectional schematic diagram illustrating an example of a configuration of an active region of a semiconductor device according to the present embodiment.

In a semiconductor device 100E according to the present embodiment, a part or all of the gate electrode 6 embedded into the trench 20 is replaced with a semiconductor layer 200E.

Note that, as a configuration of the semiconductor device according to the present embodiment in a region including a gate resistor region, any configuration of the first embodiment, the second embodiment, the third embodiment, and the fourth embodiment may be adopted. In other words, any configuration illustrated in FIG. 2, FIG. 3, FIG. 4, FIG. 5, and FIG. 6 may be adopted.

The semiconductor layer 200E is hydrogen-doped amorphous silicon or microcrystalline silicon having a negative temperature coefficient. Further, the semiconductor layer 200E may be doped with impurities such as phosphorus, boron, or arsenic at appropriate concentration.

The semiconductor layer 200E is formed inside each trench 20 surrounded by the gate insulation film 7. Further, at least a part of the semiconductor layer 200E contains 1% or more of hydrogen in atomic composition ratio.

Further, a nitride layer 300E is formed on the upper surface of the semiconductor layer 200E inside the trench 20. For the nitride layer 300E, silicon nitride (SiN) or aluminum nitride (AlN) is used.

The nitride layer 300E reduces desorption of hydrogen from the semiconductor layer 200E, and reduces long-term variation in a value of gate resistance.

In switching operation of IGBTs, currents are liable to concentrate on the surface of the switching element, causing heat generation. When the semiconductor layer 200E having a negative temperature coefficient is provided near a position where such heat generation is caused, gate resistance can be changed sensitively to heat generation of the semiconductor device.

In this structure, when currents concentrate on a specific position due to variation of currents within the surface of the semiconductor substrate, greater heat generation is caused at the position. Such heat generation reduces resistance of the semiconductor layer 200E, increasing switching speed in the cell region and reducing a period of electric conduction.

Accordingly, current concentration is reduced, and thus an element breakdown due to excessive heat generation or current concentration in an element can be reduced. Further, temperature increase in the switching element is reduced, and thus switching loss or conduction loss in actual operation can be reduced.

As described above, according to the configuration of the present embodiment, both enhancement of long-term reliability and power loss reduction of the semiconductor device 100E can be achieved.

FIG. 8 is a cross-sectional schematic diagram illustrating a modification of a configuration of an active region of the semiconductor device according to the present embodiment.

In a semiconductor device 100F, a part or all of the gate electrode 6 embedded into the trench 20 is replaced with a semiconductor layer 200F.

The semiconductor layer 200F is hydrogen-doped amorphous silicon or microcrystalline silicon having a negative temperature coefficient. Further, the semiconductor layer 200F may be doped with impurities such as phosphorus, boron, or arsenic at appropriate concentration.

Further, a nitride layer 300F is formed on the upper surface, the side surface, and the bottom surface of the semiconductor layer 200F inside each trench 20. For the nitride layer 300F, silicon nitride (SiN) or aluminum nitride (AlN) is used.

According to such a configuration, desorption of hydrogen from the semiconductor layer 200F can be reduced. As a result, long-term reliability of the gate resistor can be enhanced.

Sixth Embodiment

A semiconductor device according to the present embodiment will be described. In the following description, components that are similar to the components described in the above-described embodiments are denoted by the same reference signs in the drawings, and detailed description thereof will be omitted as appropriate.

<Configuration of Semiconductor Device>

Figure 9:
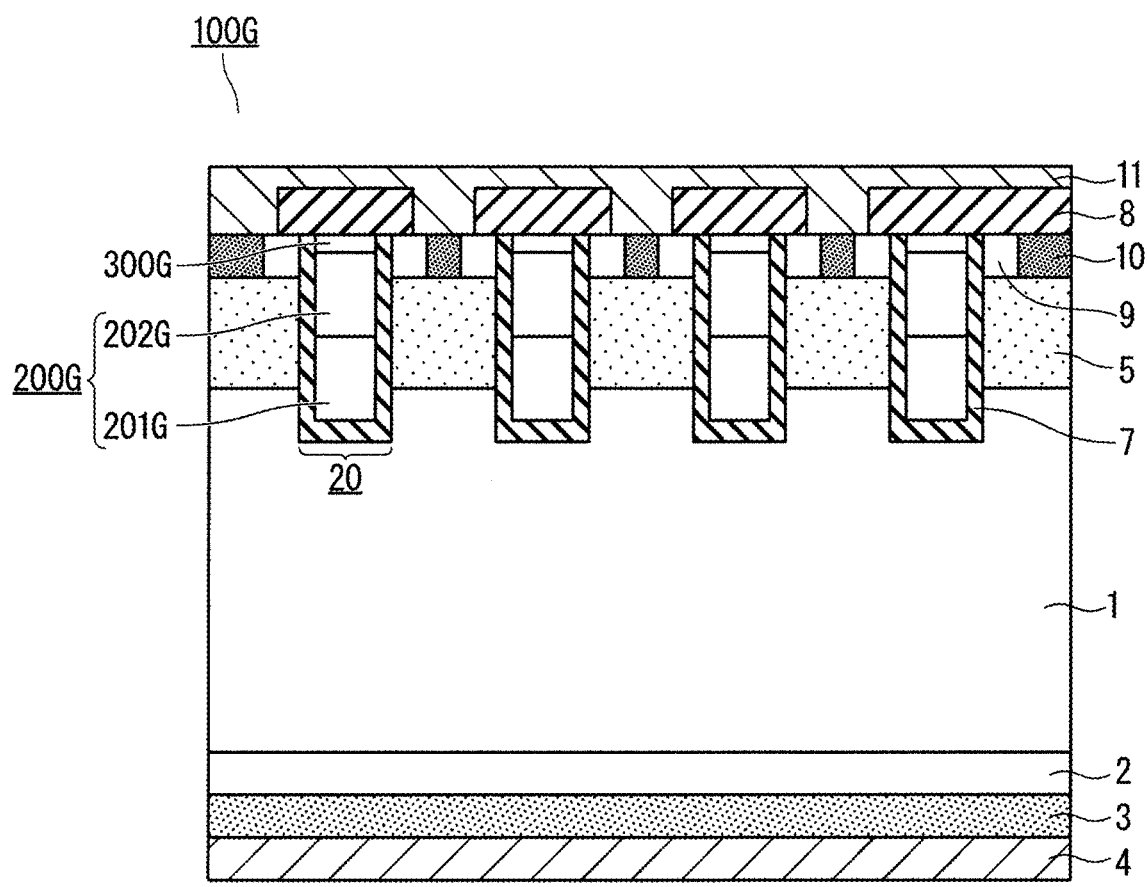
FIG. 9 is a cross-sectional schematic diagram illustrating an example of a configuration of an active region of a semiconductor device according to an embodiment.

FIG. 9 is a cross-sectional schematic diagram illustrating an example of a configuration of an active region of a semiconductor device according to the present embodiment.

In a semiconductor device 100G according to the present embodiment, a part or all of the gate electrode 6 embedded into the trench 20 is replaced with a semiconductor layer 200G.

As illustrated in FIG. 9, the semiconductor layer 200G includes a semiconductor layer 201G, and a semiconductor layer 202G formed on the upper surface of the semiconductor layer 201G.

The semiconductor layer 201G is made of hydrogen-doped amorphous silicon. In contrast, the semiconductor layer 202G is made of amorphous silicon or microcrystalline silicon having crystallinity higher than crystallinity of the semiconductor layer 201G. Further, at least a part of the semiconductor layer 201G and the semiconductor layer 202G contains 1% or more of hydrogen in atomic composition ratio.

Further, the semiconductor layer 201G and the semiconductor layer 202G may be doped with impurities such as phosphorus, boron, or arsenic at appropriate concentration.

Further, a nitride layer 300G is formed on the upper surface of the semiconductor layer 202G inside the trench 20. For the nitride layer 300G, silicon nitride (SiN) or aluminum nitride (AlN) is used.

The nitride layer 300G reduces desorption of hydrogen from the semiconductor layer 200G, and reduces long-term variation in a value of gate resistance.

According to such a configuration, desorption of hydrogen from the semiconductor layer 201G is reduced by the semiconductor layer 202G formed on the upper surface of the semiconductor layer 201G. As a result, reliability of the embedded gate resistor is enhanced.

Figure 10:
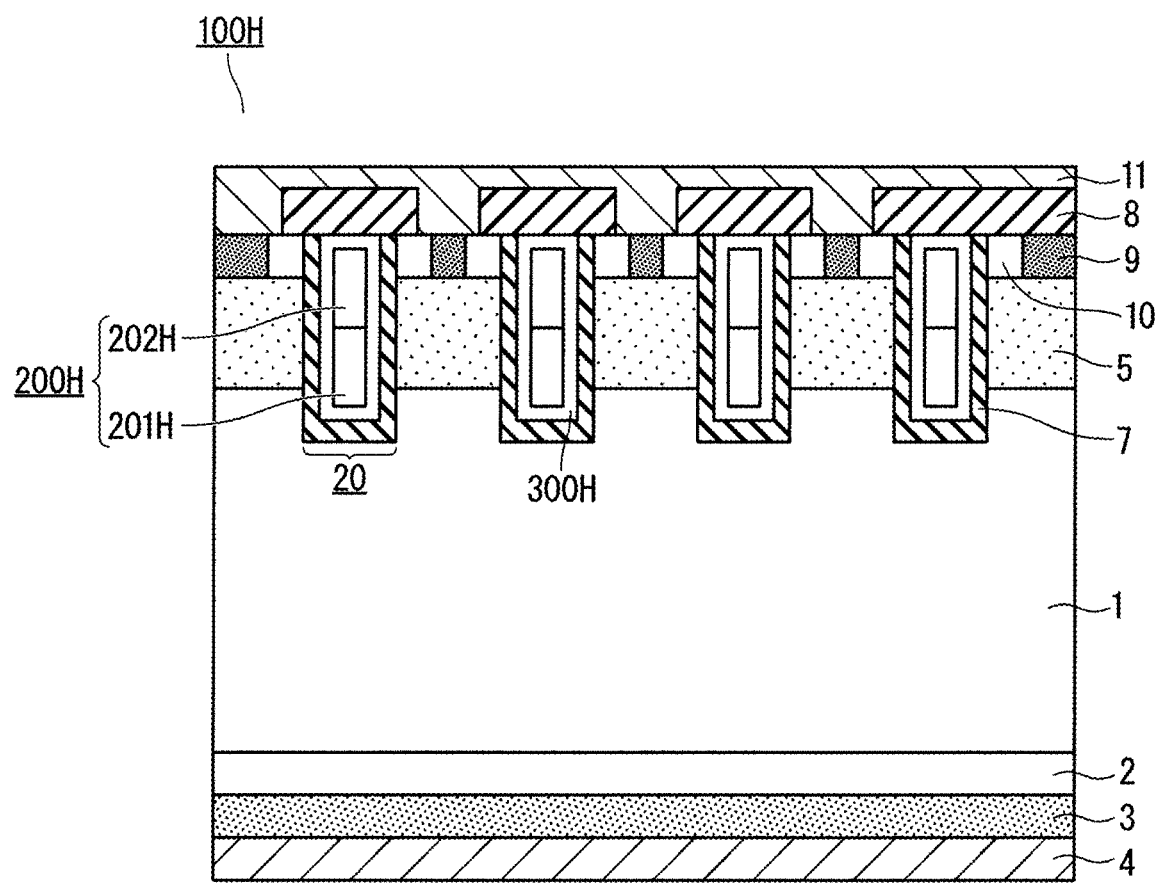
FIG. 10 is a cross-sectional schematic diagram illustrating a modification of a configuration of an active region of a semiconductor device according to an embodiment.

FIG. 10 is a cross-sectional schematic diagram illustrating a modification of a configuration of an active region of the semiconductor device according to the present embodiment.

In a semiconductor device 100H, a part or all of the gate electrode 6 embedded into the trench 20 is replaced with a semiconductor layer 200H.

As illustrated in FIG. 10, the semiconductor layer 200H includes a semiconductor layer 201H, and a semiconductor layer 202H formed on the upper surface of the semiconductor layer 201H.

The semiconductor layer 201H is made of hydrogen-doped amorphous silicon. In contrast, the semiconductor layer 202H is made of amorphous silicon or microcrystalline silicon having crystallinity higher than crystallinity of the semiconductor layer 201H. Further, at least a part of the semiconductor layer 201H and the semiconductor layer 202H contains 1% or more of hydrogen in atomic composition ratio.

Further, the semiconductor layer 201H and the semiconductor layer 202H may be doped with impurities such as phosphorus, boron, or arsenic at appropriate concentration.

Further, a nitride layer 300H is formed on the upper surface, the side surface, and the bottom surface of the semiconductor layer 200H inside each trench 20. In other words, the nitride layer 300H is formed to cover the upper surface and the side surface of the semiconductor layer 202H and the side surface and the bottom surface of the semiconductor layer 201H. For the nitride layer 300H, silicon nitride (SiN) or aluminum nitride (AlN) is used.

According to such a structure, desorption of hydrogen from the semiconductor layer 200H can be reduced. As a result, long-term reliability of the gate resistor can be enhanced.

Seventh Embodiment

A semiconductor device according to the present embodiment will be described. In the following description, components that are similar to the components described in the above-described embodiments are denoted by the same reference signs in the drawings, and detailed description thereof will be omitted as appropriate.

<Configuration of Semiconductor Device>

Figure 12:
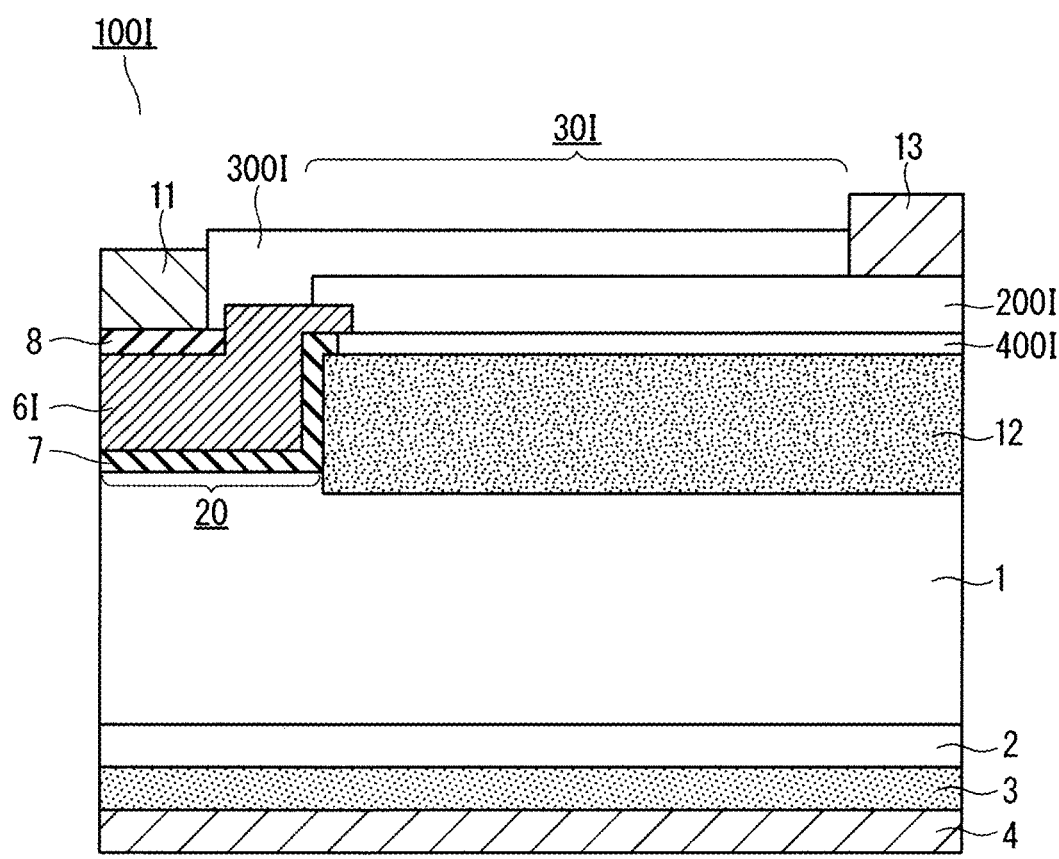
FIG. 12 is a cross-sectional schematic diagram illustrating an example of a configuration in a region including a gate resistor region embedded into a semiconductor chip according to an embodiment.

FIG. 12 is a cross-sectional schematic diagram illustrating an example of a configuration in a region including a gate resistor region embedded into a semiconductor chip according to the present embodiment As illustrated in FIG. 12, in a semiconductor device 100I, in a part or all of a region immediately below a semiconductor layer 200I (first resistance layer) having a negative temperature coefficient and constituting an embedded gate resistor 30I, an $SiO_2$ film being the gate insulation film 7 is removed, and a nitride layer 400I (second nitride layer) made of a silicon nitride or aluminum nitride film is formed instead.

As illustrated in FIG. 12, the semiconductor layer 200I is formed above the upper surface of the p-type well layer 12, with the nitride layer 400I being interposed therebetween. In other words, the nitride layer 400I is formed in direct contact with the upper surface of the p-type well layer 12.

The semiconductor layer 200I is hydrogen-doped amorphous silicon or microcrystalline silicon having a negative temperature coefficient. Further, the semiconductor layer 200I may be doped with phosphorus, boron, arsenic, or the like at appropriate concentration.

Further, a nitride layer 300I is formed to cover the semiconductor layer 200I. For the nitride layer 300I, silicon nitride (SiN) or aluminum nitride (AlN) is used. The nitride layer 300I is formed to cover a part of the upper surface of the inter-layer insulation film 8, a part of the upper surface of a gate electrode 6I, and a part of the upper surface of the semiconductor layer 200I. The gate electrode 6I is formed above a part of the upper surface of the n⁻-type drift layer 1 and inside the trench 20, with the gate insulation film 7 being interposed therebetween.

Nitride has thermal conductivity higher than thermal conductivity of $SiO_2$ by approximately one to two digits. Accordingly, owing to heat generated in the active region efficiently reaching the semiconductor layer 200I through the nitride layer 400I, temperature difference between the active region and the resistance layer (semiconductor layer 200I) can be reduced.

This allows resistance of the resistance layer (semiconductor layer 200I) to vary more in accordance with temperature variation. Further, the nitride layer 400I can reduce desorption of hydrogen from the resistance layer (semiconductor layer 200I). As a result, long-term reliability of the gate resistor can also be enhanced.

Eighth Embodiment

A semiconductor device according to the present embodiment will be described. In the following description, components that are similar to the components described in the above-described embodiments are denoted by the same reference signs in the drawings, and detailed description thereof will be omitted as appropriate.

<Configuration of Semiconductor Device>

Figure 13:
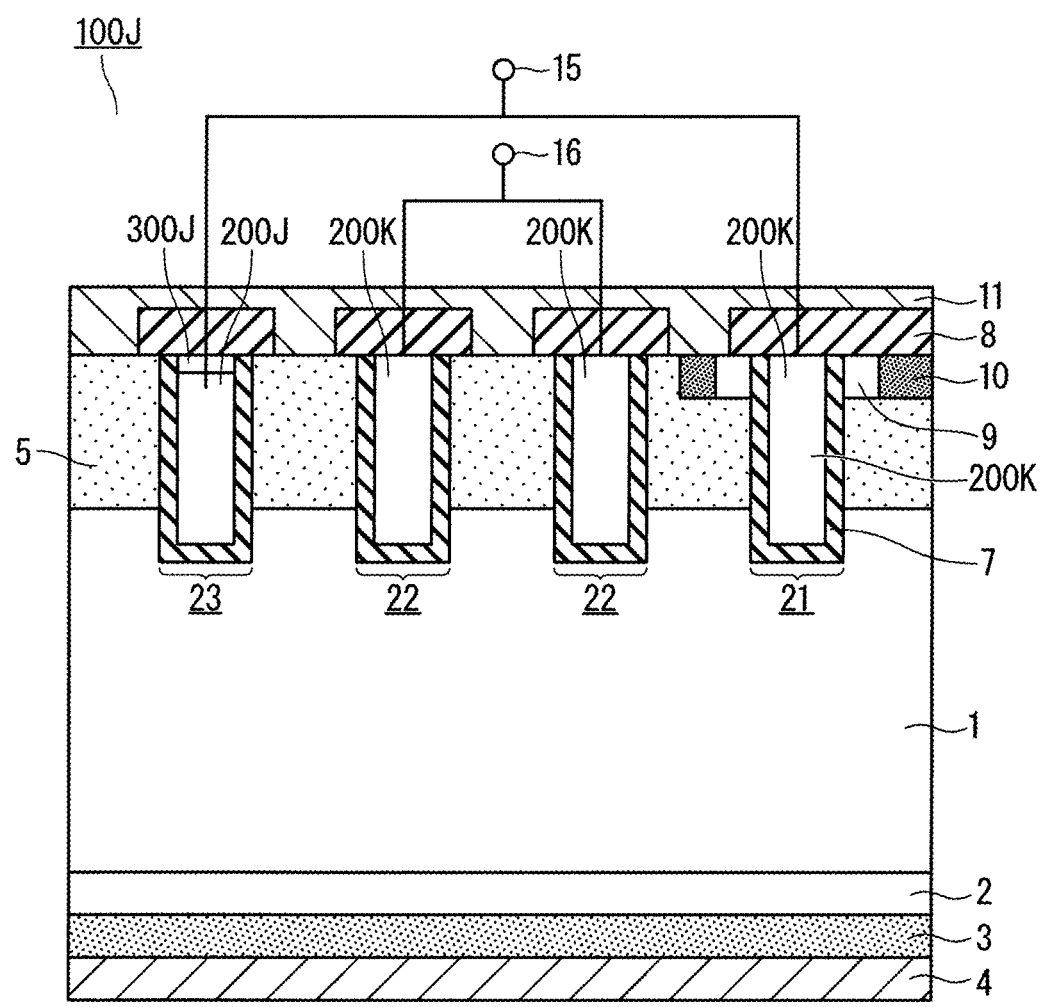
FIG. 13 is a cross-sectional schematic diagram illustrating an example of a configuration of an active region of a semiconductor device according to an embodiment.

FIG. 13 is a cross-sectional schematic diagram illustrating an example of a configuration of an active region of a semiconductor device according to the present embodiment.

As illustrated in FIG. 13, in a semiconductor device 100J being a trench gate semiconductor device, an n⁻-type silicon substrate is used as the n⁻-type drift layer 1. Further, the p-type base layer 5 is formed on the surface layer of the n⁻-type drift layer 1.

Here, trench gates of the trench gate semiconductor device are classified into three types. The first type is exemplified by an active gate 21 (third trench), which has channel(s) being formed on one or both side walls. In FIG. 13, such an active gate 21 is connected to a gate terminal 15. The second type is exemplified by a dummy gate 22 (second trench), which is not connected to a gate electrode but is connected to a floating potential or an emitter potential. In FIG. 13, such dummy gates 22 are connected to an emitter terminal 16. Lastly, the third type is exemplified by an active dummy gate 23 (first trench), which is connected to a gate electrode but has no channels being formed on its side walls. In FIG. 13, such an active dummy gate 23 is connected to the gate terminal 15.

In the present embodiment, the gate electrode embedded into the trench of the active dummy gate 23 is replaced with a semiconductor layer 200J (first gate electrode) and a nitride layer 300J on the upper surface of the semiconductor layer 200J.

The semiconductor layer 200J is hydrogen-doped amorphous silicon or microcrystalline silicon having a negative temperature coefficient. Further, the semiconductor layer 200J may be doped with phosphorus, boron, arsenic, or the like at appropriate concentration. Further, at least a part of the semiconductor layer 200J contains 1% or more of hydrogen in atomic composition ratio.

Further, the nitride layer 300J is made of silicon nitride or aluminum nitride.

In contrast, a semiconductor layer 200K (second gate electrode) whose resistance only subtly varies according to temperature is embedded into the active gate 21 and into the dummy gate 22. For example, the semiconductor layer 200K is polysilicon doped with boron or phosphorus at high concentration.

According to such a configuration, resistance inside the active dummy gate 23 is reduced when the temperature is increased. Thus, switching speed of the entire element is increased. Consequently, switching loss under high temperature can be reduced.

In contrast, resistance inside the active gate 21 does not vary depending on temperature, and accordingly, timing at which the channel is turned on or off does not depend on temperature. If the semiconductor layer 200J having a negative temperature coefficient is used as an internal electrode of the active gate 21, in a case of local heat generation, the channel of the region is preferentially turned on, which may cause concentration of currents and damage the element.

In contrast, according to the present embodiment, switching speed of the active gate 21 is constant regardless of temperature. This allows for a uniform flow of currents within the active region even under high temperature. As a result, reliability of the semiconductor device can be enhanced.

Modification of First to Eighth Embodiments

The above-described embodiments presuppose the use of an n⁻-type silicon substrate as the material of the n⁻-type drift layer 1. However, the material of the n⁻-type drift layer 1 is not limited to silicon, and may be, for example, a wide-bandgap semiconductor, such as gallium nitride, silicon carbide, aluminum nitride, diamond, and gallium oxide.

Here, the wide bandgap semiconductor generally refers to a semiconductor having a bandgap of approximately 2 eV or more, known examples of which include group III nitrides such as gallium nitride (GaN), group II oxides such as zinc oxide (ZnO), group II chalcogenides such as zinc selenide (ZnSe), diamond, and silicon carbide.

Further, the above-described embodiments describe an example in which a trench gate IGBT is used as a switching element. However, the above-described embodiments can also be applied when a vertical MOS transistor, a reverse conducting IGBT (RC-IGBT), or the like is used.

<Effects Produced by Above-Described Embodiments>

Next, examples of effects produced by the above-described embodiments are illustrated. Note that the following will describe the effects based on specific configurations illustrated in the above-described embodiments. Such specific configurations, however, may be replaced with other specific configurations illustrated in the specification of the present application as long as similar effects are produced.

Further, the replacement may involve a plurality of embodiments. In other words, a case in which similar effects are produced through a combination of configurations illustrated in different embodiments is applicable.

According to the above-described embodiments, a semiconductor device includes an n⁻-type drift layer 1, a p-type base layer 5, an n⁺-type emitter layer 9, a gate insulation film 7, a gate electrode 6A, a gate pad electrode 13, a first resistance layer, and a first nitride layer. Here, the first resistance layer corresponds to at least one of the semiconductor layer 200, the semiconductor layer 200B, the semiconductor layer 201, and the semiconductor layer 201D, for example. Further, the first nitride layer corresponds to at least one of the nitride layer 300, the nitride layer 300B, the nitride layer 300C, and the nitride layer 300D, for example. The p-type base layer 5 is formed on the surface layer of the n⁻-type drift layer 1. The n⁺-type emitter layer 9 is selectively formed on the surface layer of the p-type base layer 5. The gate insulation film 7 is formed in contact with the p-type base layer 5 interposed between the n⁻-type drift layer 1 and the n⁺-type emitter layer 9. The gate electrode 6A is formed in contact with the gate insulation film 7. The gate pad electrode 13 is formed apart from the gate electrode 6A. The semiconductor layer 200 electrically connects the gate electrode 6A and the gate pad electrode 13. The nitride layer 300 is formed to cover the upper surface of the semiconductor layer 200. Further, a resistor of the semiconductor layer 200 has a negative temperature coefficient. Further, the semiconductor layer 200 is made of hydrogen-doped amorphous silicon. Further, the nitride layer 300 is made of a silicon nitride layer or an aluminum nitride layer.

According to such a configuration, the nitride layer 300 is formed on the upper surface of the semiconductor layer 200 being amorphous silicon containing additives of hydrogen. Therefore, desorption of hydrogen from the semiconductor layer 200 being amorphous silicon can be reduced even during high-temperature operation. As a result, variation in temperature characteristics and a resistance value of a gate resistor is reduced, and reliability of the gate resistor can be enhanced.

Note that other configurations illustrated in the specification of the present application different from the above configurations may be omitted as appropriate. In other words, the above-described effects can be produced on the condition that the above configurations are at least provided.

However, similar effects can be produced also when at least one of such other configurations illustrated in the specification of the present application is added to the above-described configurations as appropriate, i.e., also when other configuration(s) that is illustrated in the specification of the present application but is not mentioned as the above-described configurations is added as appropriate.

Further, according to the above-described embodiments, the semiconductor device includes a trench 20 formed to extend from the upper surface of the n⁻-type drift layer 1 into the n⁻-type drift layer 1, penetrating the n⁺-type emitter layer 9 and the p-type base layer 5. The gate insulation film 7 is formed along the bottom surface and the side surface of the trench 20. Further, the gate electrode 6A is formed inside the trench 20 surrounded by the gate insulation film 7. According to such a configuration, desorption of hydrogen from the semiconductor layer 200 being amorphous silicon can be reduced even during high-temperature operation. As a result, variation in temperature characteristics and a resistance value of a gate resistor is reduced, and reliability of the gate resistor can be enhanced.

Further, according to the above-described embodiments, at least a part of the semiconductor layer 200 contains 1% or more of hydrogen in atomic composition ratio. According to such a configuration, the nitride layer 300 is formed on the upper surface of the semiconductor layer 200 being amorphous silicon containing additives of hydrogen. Therefore, desorption of hydrogen from the semiconductor layer 200 being amorphous silicon can be reduced even during high-temperature operation.

Further, according to the above-described embodiments, the gate electrode 6A is made of polysilicon. According to such a configuration, the nitride layer 300 is formed on the upper surface of the semiconductor layer 200 being amorphous silicon containing additives of hydrogen. Therefore, desorption of hydrogen from the semiconductor layer 200 being amorphous silicon can be reduced even during high-temperature operation.

Further, according to the above-described embodiments, the semiconductor device includes a second nitride layer formed to cover the lower surface of the semiconductor layer 200B. Here, the second nitride layer corresponds to the nitride layer 301, for example. According to such a configuration, desorption of hydrogen from the semiconductor layer 200B into the gate insulation film 7 can be reduced. Consequently, long-term reliability of the embedded gate resistor 30B can be enhanced. Further, deterioration in performance of the semiconductor device due to entering of hydrogen atoms into the gate insulation film 7 can be reduced.

Further, according to the above-described embodiments, the semiconductor device includes a second resistance layer formed on the upper surface of the semiconductor layer 201. Here, the second resistance layer corresponds to the semiconductor layer 202, for example. Further, the nitride layer 300C is formed to cover the upper surface of the semiconductor layer 202. Further, the semiconductor layer 201 and the semiconductor layer 202 contain 1% or more of hydrogen in atomic composition ratio. Further, crystallinity of the semiconductor layer 202 is higher than crystallinity of the semiconductor layer 201. According to such a configuration, desorption of hydrogen from the semiconductor layer 201 can be reduced by the semiconductor layer 202 and the nitride layer 300C. Therefore, time-dependent variation in a resistance value of the embedded gate resistor 30C can be reduced. As a result, a semiconductor device having high long-term reliability can be provided.

Further, according to the above-described embodiments, the semiconductor device includes a second resistance layer formed on the upper surface, the side surface, and the lower surface of the semiconductor layer 201D. Here, the second resistance layer corresponds to the semiconductor layer 202D, for example. Further, the nitride layer 300D is formed to cover the upper surface of the semiconductor layer 202D. Further, the semiconductor layer 201D and the semiconductor layer 202D contain 1% or more of hydrogen in atomic composition ratio. Further, crystallinity of the semiconductor layer 202D is higher than crystallinity of the semiconductor layer 201D. According to such a configuration, desorption of hydrogen from the semiconductor layer 201D can be reduced by the semiconductor layer 202D and the nitride layer 300D.

Further, according to the above-described embodiments, the first resistance layer is amorphous silicon containing 1% or more of hydrogen in atomic composition ratio. Further, the second resistance layer is microcrystalline silicon containing 1% or more of hydrogen in atomic composition ratio. According to such a configuration, desorption of hydrogen from the first resistance layer can be reduced by the second resistance layer and the first nitride layer.

Further, according to the above-described embodiments, the semiconductor device includes an n⁻-type drift layer 1, a p-type base layer 5, an n⁺-type emitter layer 9, a trench 20, a gate insulation film 7, a first gate electrode, and a first nitride layer. Here, the first gate electrode corresponds to at least one of the semiconductor layer 200E, the semiconductor layer 200F, the semiconductor layer 201G, and the semiconductor layer 201H, for example. Further, the first nitride layer corresponds to at least one of the nitride layer 300E, the nitride layer 300F, the nitride layer 300G, and the nitride layer 300H, for example. The p-type base layer 5 is formed on the surface layer of the n$^-$-type drift layer 1. The n$^+$-type emitter layer 9 is selectively formed on the surface layer of the p-type base layer 5. The trench 20 is formed to extend from the upper surface of the n$^-$-type drift layer 1 into the n$^-$-type drift layer 1, penetrating the n$^+$-type emitter layer 9 and the p-type base layer 5. The gate insulation film 7 is formed along the bottom surface and the side surface of the trench 20. The semiconductor layer 200E is formed inside the trench 20 surrounded by the gate insulation film 7. The nitride layer 300E is formed to cover at least the upper surface of the semiconductor layer 200E. Further, a resistor of the semiconductor layer 200E has a negative temperature coefficient. Further, the semiconductor layer 200E is made of hydrogen-doped amorphous silicon. Further, at least a part of the semiconductor layer 200E contains 1% or more of hydrogen in atomic composition ratio. Further, the nitride layer 300E is made of a silicon nitride layer or an aluminum nitride layer. According to such a configuration, when the semiconductor layer 200E having a negative temperature coefficient is formed as a gate electrode in the trench 20, gate resistance can be changed sensitively to temperature variation of an element. Accordingly, temperature increase in the element can be moderated, with current concentration being reduced. Therefore, both reliability enhancement and power loss reduction of the gate resistor can be achieved. Further, when the nitride layer 300E is formed on the upper surface of the semiconductor layer 200E, desorption of hydrogen from the semiconductor layer 200E can be reduced. Consequently, long-term reliability of the gate resistor can be enhanced.

Note that other configurations illustrated in the specification of the present application different from the above configurations may be omitted as appropriate. In other words, the above-described effects can be produced on the condition that the above configurations are at least provided.

However, similar effects can be produced also when at least one of such other configurations illustrated in the specification of the present application is added to the above-described configurations as appropriate, i.e., also when other configuration(s) that is illustrated in the specification of the present application but is not mentioned as the above-described configurations is added as appropriate.

Further, according to the above-described embodiments, the nitride layer 300F is formed to cover the upper surface, the side surface, and the bottom surface of the semiconductor layer 200F. According to such a configuration, desorption of hydrogen from the semiconductor layer 200F can be reduced. As a result, long-term reliability of the gate resistor can be enhanced.

Further, according to the above-described embodiments, the semiconductor device includes a second gate electrode formed on the upper surface of the first gate electrode. Here, the second gate electrode corresponds to at least one of the semiconductor layer 202G and the semiconductor layer 202H, for example. The nitride layer 300G is formed to cover at least the upper surface of the semiconductor layer 202G. Further, the semiconductor layer 201G and the semiconductor layer 202G contain 1% or more of hydrogen in atomic composition ratio. Further, crystallinity of the semiconductor layer 202G is higher than crystallinity of the semiconductor layer 201G. According to such a configuration, desorption of hydrogen from the semiconductor layer 201G is reduced by the semiconductor layer 202G formed on the upper surface of the semiconductor layer 201G. As a result, reliability of the embedded gate resistor is enhanced.

Further, according to the above-described embodiments, the semiconductor layer 201G is amorphous silicon containing 1% or more of hydrogen in atomic composition ratio. Further, the semiconductor layer 202G is microcrystalline silicon containing 1% or more of hydrogen in atomic composition ratio. According to such a configuration, desorption of hydrogen from the semiconductor layer 201G is reduced by the semiconductor layer 202G formed on the upper surface of the semiconductor layer 201G. As a result, reliability of the embedded gate resistor is enhanced.

Further, according to the above-described embodiments, the nitride layer 300H is formed to cover the upper surface and the side surface of the semiconductor layer 202H and the side surface and the bottom surface of the semiconductor layer 201H. According to such a configuration, when the outer peripheral part of the semiconductor layer 201H and the semiconductor layer 202H is covered by the nitride layer 300H, desorption of hydrogen from the semiconductor layer 200H can be reduced. As a result, long-term reliability of the gate resistor can be enhanced.

Further, according to the above-described embodiments, the semiconductor device includes a gate pad electrode 13, a resistance layer, and a second nitride layer. Here, the resistance layer corresponds to at least one of the semiconductor layer 200, the semiconductor layer 200B, the semiconductor layer 201, and the semiconductor layer 201D, for example. Further, the second nitride layer corresponds to at least one of the nitride layer 300, the nitride layer 300B, the nitride layer 300C, and the nitride layer 300D, for example. The gate pad electrode 13 is formed apart from the semiconductor layer 200E. The semiconductor layer 200 electrically connects the semiconductor layer 200E and the gate pad electrode 13. The nitride layer 300 is formed to cover the upper surface of the semiconductor layer 200. Further, a resistor of the semiconductor layer 200 has a negative temperature coefficient. Further, the semiconductor layer 200 is made of hydrogen-doped amorphous silicon. Further, the nitride layer 300 is made of a silicon nitride layer or an aluminum nitride layer. According to such a configuration, the nitride layer 300 is formed on the upper surface of the semiconductor layer 200 being amorphous silicon containing additives of hydrogen. Therefore, desorption of hydrogen from the semiconductor layer 200 being amorphous silicon can be reduced even during high-temperature operation. As a result, variation in temperature characteristics and a resistance value of a gate resistor is reduced, and reliability of the gate resistor can be enhanced.

<Modifications of Above-Described Embodiments>

The above-described embodiments may specify quality of a material, a material, a dimension, a shape, a relative relation in arrangement, a condition of implementation, etc. of each component. These, however, are merely examples in all aspects, and the above-described embodiments are not limited to the embodiments described in the specification of the present application.

Thus, numerous unillustrated modifications and equivalents are devised within the scope of the technology disclosed in the specification of the present application. For example, the scope of the technology disclosed in the specification of the present application encompasses a case where at least one component is modified, added, or omitted, and a case where at least one component selected from at least one embodiment is combined with a component of another embodiment.

Further, each component in the above-described embodiments represents a conceptual unit. The scope of the technology disclosed in the specification of the present application encompasses a case where one component consists of a plurality of structures, a case where one component corresponds to a part of a certain structure, and a case where a plurality of components is included in one structure.

Further, each component in the above-described embodiments encompasses a structure having another configuration or shape as long as the structure serves the same function.

Further, description of the specification of the present application is referred to for every purpose related to the present technology, none of which shall be acknowledged as prior art.

Further, when the above-described embodiments give an unspecified name of a material, such a material encompasses the material containing other additives, such as an alloy, on the condition that consistency is maintained.

EXPLANATION OF REFERENCE SIGNS

1 Drift layer, 2 Buffer layer, 3 Collector layer, 4 Collector electrode, 5 Base layer, 6, 6A, 6B, 6C, 6D, 6I Gate electrode, 7 Gate insulation film, 8 Inter-layer insulation film, 9 Emitter layer, 10 Contact layer, 11 Emitter electrode, 12 Well layer, 13 Gate pad electrode, 14 Contact hole, 15 Gate terminal, 16 Emitter terminal, 20 Trench, 21 Active gate, 22 Dummy gate, 23 Active dummy gate, 30, 30A, 30B, 30C, 30D, 30I Embedded gate resistor, 100, 100A, 100B, 100C, 100D, 100E, 100F, 100G, 100H, 100I, 100J Semiconductor device, 200, 200B, 200C, 200D, 200E, 200F, 200G, 200H, 200I, 200J, 200K, 201, 201D, 201G, 201H, 202, 202D, 202G, 202H Semiconductor layer, 300, 300B, 300C, 300D, 300E, 300F, 300G, 300H, 300I, 300J, 301, 400I Nitride layer

The invention claimed is:
1. A semiconductor device comprising:
a first conductivity-type drift layer;
a second conductivity-type base layer being formed on a surface layer of the first conductivity-type drift layer;
a first conductivity-type emitter layer being selectively formed on a surface layer of the second conductivity-type base layer;
a gate insulation film being formed in contact with the second conductivity-type base layer being interposed between the first conductivity-type drift layer and the first conductivity-type emitter layer;
a gate electrode being formed in contact with the gate insulation film;
a gate pad electrode being formed apart from the gate electrode;
a first resistance layer electrically connecting the gate electrode and the gate pad electrode; and
a first nitride layer being formed to cover an upper surface of the first resistance layer, wherein
a resistor of the first resistance layer has a negative temperature coefficient,
the first resistance layer is made of hydrogen-doped amorphous silicon, and
the first nitride layer is made of a silicon nitride layer or an aluminum nitride layer,
the semiconductor device further comprising
a second resistance layer being formed on the upper surface of the first resistance layer, wherein
the first nitride layer is formed to cover an upper surface of the second resistance layer,
the first resistance layer and the second resistance layer contain 1% or more of hydrogen in atomic composition ratio, and
crystallinity of the second resistance layer is higher than crystallinity of the first resistance layer.

2. The semiconductor device according to claim 1, wherein
the second resistance layer is formed on an upper surface, a side surface, and a lower surface of the first resistance layer.

3. The semiconductor device according to claim 1, wherein
the second resistance layer is microcrystalline silicon containing 1% or more of hydrogen in atomic composition ratio.

4. The semiconductor device according to claim 1, wherein
the gate electrode is made of polysilicon.

5. The semiconductor device according to claim 1, further comprising
a second nitride layer being formed to cover a lower surface of the first resistance layer.

6. The semiconductor device according to claim 5, further comprising
a second conductivity-type well layer being formed in direct contact with a part or all of a lower surface of the second nitride layer.

7. The semiconductor device according to claim 1, wherein
the gate electrode is in direct contact with the first resistance layer.

8. A semiconductor device comprising:
a first conductivity-type drift layer;
a second conductivity-type base layer being formed on a surface layer of the first conductivity-type drift layer;
a first conductivity-type emitter layer being selectively formed on a surface layer of the second conductivity-type base layer;
a trench being formed to extend from an upper surface of the first conductivity-type drift layer into the first conductivity-type drift layer, penetrating the first conductivity-type emitter layer and the second conductivity-type base layer;
a gate insulation film being formed along a bottom surface and a side surface of the trench;
a first gate electrode being formed inside the trench being surrounded by the gate insulation film; and
a first nitride layer being formed to cover at least an upper surface of the first gate electrode, wherein
a resistor of the first gate electrode has a negative temperature coefficient,
the first gate electrode is made of hydrogen-doped amorphous silicon,
at least a part of the first gate electrode contains 1% or more of hydrogen in atomic composition ratio, and
the first nitride layer is made of a silicon nitride layer or an aluminum nitride layer,
the semiconductor device further comprising
a second gate electrode being formed on the upper surface of the first gate electrode, wherein
the first nitride layer is formed to cover at least an upper surface of the second gate electrode,
the first gate electrode and the second gate electrode contain 1% or more of hydrogen in atomic composition ratio, and crystallinity of the second gate electrode is higher than crystallinity of the first gate electrode.

9. The semiconductor device according to claim 8, wherein
the first nitride layer is formed to cover the upper surface, a side surface, and a bottom surface of the first gate electrode and the second gate electrode.

10. The semiconductor device according to claim 8, wherein
the second gate electrode is microcrystalline silicon containing 1% or more of hydrogen in atomic composition ratio.

* * * * *